(12) United States Patent
Ogino et al.

(10) Patent No.: US 8,319,510 B2
(45) Date of Patent: Nov. 27, 2012

(54) PRE-ALIGNMENT METHOD OF SEMICONDUCTOR WAFER AND COMPUTER-READABLE RECORDING MEDIUM HAVING PRE-ALIGNMENT PROGRAM RECORDED THEREON

(75) Inventors: Kazuhito Ogino, Nirasaki (JP); Toshihiko Iijima, Nirasaki (JP); Kaori Arai, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 252 days.

(21) Appl. No.: 12/817,876

(22) Filed: Jun. 17, 2010

(65) Prior Publication Data
US 2010/0321052 A1    Dec. 23, 2010

(30) Foreign Application Priority Data
Jun. 19, 2009  (JP) ................................ 2009-147059

(51) Int. Cl.
   *G01R 31/00*   (2006.01)
   *G01R 31/20*   (2006.01)
(52) U.S. Cl. ............................ 324/750.16; 324/757.01
(58) Field of Classification Search ............. 324/750.16, 324/757.01
   See application file for complete search history.

(56) References Cited

U.S. PATENT DOCUMENTS

| | | | | |
|---|---|---|---|---|
| 5,740,034 A * | 4/1998 | Saeki ................................ 700/59 |
| 5,777,485 A * | 7/1998 | Tanaka et al. ............. 324/750.16 |
| 6,008,636 A * | 12/1999 | Miller et al. .............. 324/757.01 |
| 6,111,421 A * | 8/2000 | Takahashi et al. ........ 324/750.04 |
| 6,333,636 B1 * | 12/2001 | Kim .......................... 324/750.16 |
| 6,800,803 B1 * | 10/2004 | Marumo ........................ 174/382 |
| 6,958,618 B2 * | 10/2005 | Amemiya et al. ........ 324/756.03 |
| 7,129,694 B2 * | 10/2006 | Brunner et al. ........... 324/750.14 |
| 7,196,507 B2 * | 3/2007 | Schneidewind et al. . 324/750.16 |
| 7,221,175 B2 * | 5/2007 | Ramamoorthi .......... 324/750.25 |
| 7,960,980 B2 * | 6/2011 | Baccini ..................... 324/750.16 |
| 8,159,242 B2 * | 4/2012 | Heigl et al. .............. 324/750.16 |
| 2006/0152211 A1 * | 7/2006 | Iijima et al. ................. 324/158.1 |
| 2007/0062446 A1 * | 3/2007 | Iijima et al. .................. 118/500 |
| 2008/0290886 A1 * | 11/2008 | Akiyama et al. .............. 324/758 |

FOREIGN PATENT DOCUMENTS

JP          2008-78210 A       4/2008
* cited by examiner

*Primary Examiner* — Huy Q Phan
*Assistant Examiner* — Joshua Benitez Rosario
(74) *Attorney, Agent, or Firm* — Abelman, Frayne & Schwab

(57) ABSTRACT

Disclosed is a pre-alignment method and a computer-readable medium storing a pre-alignment program capable of reducing pre-alignment time and transfer time of a semiconductor wafer. The pre-alignment method includes steps of rotating the semiconductor wafer transferred from a receiving unit onto a rotating body of a pre-alignment mechanism by a transfer mechanism, calculating and storing an eccentric value between a shaft center of the rotating body and a center of the semiconductor wafer detected by a sensor of the pre-alignment mechanism, correcting a positional deviation of the semiconductor wafer on the rotating body by the transfer mechanism according to the calculated eccentric value, when the calculated eccentric value exceeds a predetermined value, and estimating the eccentric value when conducting the pre-alignment operation for a succeeding semiconductor wafer, based on the eccentric value accumulated during the pre-alignment operation conducted for semiconductor wafers prior to the succeeding semiconductor wafer.

6 Claims, 3 Drawing Sheets

CONTROL APPARATUS

PRE-ALIGNMENT METHOD OF SEMICONDUCTOR WAFER AND COMPUTER-READABLE RECORDING MEDIUM HAVING PRE-ALIGNMENT PROGRAM RECORDED THEREON This application is based on and claims priority from Japanese Patent Application No. 2009-147059, filed on Jun. 19, 2009, with the Japanese Patent Office, the disclosure of which is incorporated herein in its entirety by reference.

TECHNICAL FIELD

The present disclosure relates to a pre-alignment method of a semiconductor wafer conducted before processing the semiconductor wafer, and a computer-readable medium storing a program for the pre-alignment method.

BACKGROUND

A pre-alignment operation has been performed in various procedures of a semiconductor wafer processing to align the semiconductor wafer to a predetermined direction prior to main processing steps.

Conventional pre-alignment technology performed by an inspection apparatus prior to electrical characteristic inspection of a semiconductor wafer, is disclosed, for example, in Japanese Patent Application Laid-Open No. 2008-078210. The inspection apparatus includes a loader chamber that loads/unloads the semiconductor wafer, and a prober chamber that conducts electrical characteristic inspection of the semiconductor wafer. Conventional pre-alignment processing is performed in the loader chamber using a pre-alignment mechanism while the semiconductor wafer is being transferred from the loader chamber to the prober chamber, prior to the electrical characteristic inspection of the semiconductor wafer in the prober chamber. The description for a conventional pre-alignment method will be followed.

Conventional pre-alignment mechanism includes a rotatable table for mounting a semiconductor wafer thereon, and an optical detection unit for optically detecting orientation plats or notches (hereinafter notches) formed around an outer periphery of the semiconductor wafer. To perform a pre-alignment of the semiconductor wafer using the pre-alignment mechanism, the semiconductor wafer housed at a cassette located in a load port is transferred to the rotatable table of the pre-alignment mechanism by a wafer transfer mechanism, and the rotatable table where the wafer is mounted is rotated at least one turn. During that time, position data are detected based on the notches of the outer periphery of the semiconductor wafer, by an optical detection unit, and an eccentric value between a center of the semiconductor wafer and a center of the rotatable table is acquired based on the position data. Subsequently, a positional deviation of the semiconductor wafer on the rotatable table is corrected by a wafer transfer mechanism based on the eccentric value, and the position data of the semiconductor wafer are acquired one more time by the optical detection unit. Then the pre-alignment is terminated by aligning the notches of the semiconductor wafer to a predetermined direction. In the series of operations, the rotation operation is performed at least twice by the rotatable table for each semiconductor wafer.

However, in the conventional pre-alignment technology, the position data of the semiconductor wafer needs to be acquired at least twice for each semiconductor wafer while transferring the semiconductor wafer so that the pre-alignment process takes a relatively long time. As a result, an overall transfer time of the semiconductor wafer tends to take longer.

SUMMARY

The pre-alignment method of the present disclosure includes rotating a semiconductor wafer on a rotating body of a pre-alignment mechanism, where the semiconductor wafer has been transferred from a receiving unit onto a rotating body of a pre-alignment mechanism by a transfer mechanism, calculating and storing an eccentric value between a shaft center of the rotating body and a center of the semiconductor wafer where the shaft center of the rotating body and the center of the semiconductor wafer being detected by a sensor of the pre-alignment mechanism, correcting a positional deviation of the semiconductor wafer on the rotating body using the transfer mechanism according to the eccentric value, when the eccentric value exceeds a predetermined value, and estimating the eccentric value for the pre-alignment operation of a succeeding semiconductor wafer, based on the eccentric value accumulated during the pre-alignment operation conducted for semiconductor wafers prior to the succeeding semiconductor wafer.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWING

FIG. 1A is a front view and FIG. 1B is a top view of a portion of prober chamber.

DETAILED DESCRIPTION

Figure 1A:
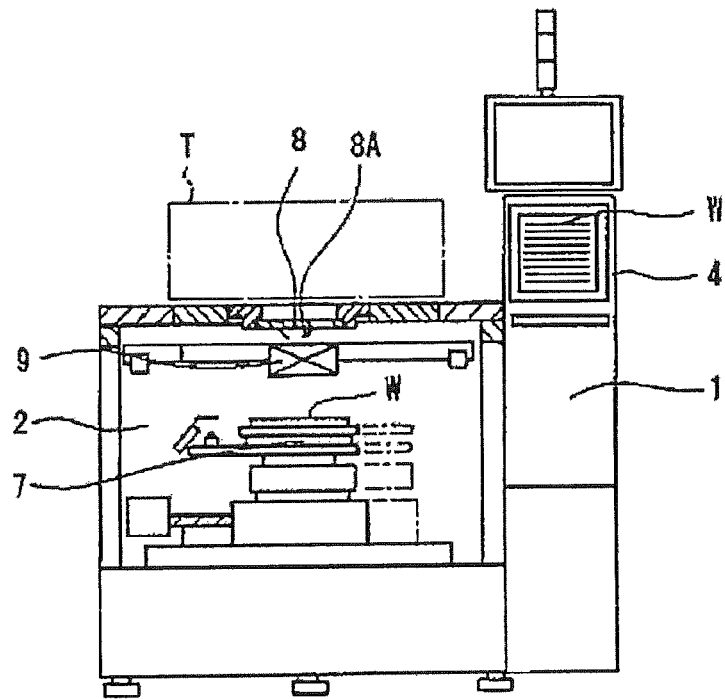
FIGS. 1A, 1B each illustrates an embodiment of the inspection apparatus to which a pre-alignment method of the present disclosure is applied.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

One of the goals of the present disclosure is to provide a pre-alignment method of a semiconductor wafer, and a computer-readable medium storing a program that can perform the pre-alignment method capable of reducing pre-alignment time and furthermore transfer time of the semiconductor wafer.

According to an embodiment, the pre-alignment method of the present disclosure includes rotating a semiconductor wafer on a rotating body of a pre-alignment mechanism, where the semiconductor wafer has been transferred from a receiving unit onto a rotating body by a transfer mechanism, calculating and storing an eccentric value between a shaft center of the rotating body and a center of the semiconductor wafer where the shaft center of the rotating body and the center of the semiconductor wafer being detected by a sensor of the pre-alignment mechanism, correcting a positional deviation of the semiconductor wafer on the rotating body by the transfer mechanism according to the eccentric value, when the eccentric value exceeds a predetermined value, and estimating the eccentric value for the pre-alignment operation of a succeeding semiconductor wafer, based on the eccentric value accumulated during the pre-alignment operation conducted for semiconductor wafers prior to the succeeding semiconductor wafer.

Specifically, the pre-alignment method further comprises transferring the succeeding semiconductor wafer from the receiving unit to the rotating body of the pre-alignment mechanism by the transfer mechanism based on the estimated eccentric value.

Additionally, a counting number of the succeeding semiconductor wafer may be a number after counting a predetermined number of semiconductor wafers.

According to another embodiment, the computer-readable medium storing a computer executable program that, when executed, causes a computer to conduct a pre-alignment operation of a semiconductor wafer to perform rotating the semiconductor wafer on a rotating body of a pre-alignment mechanism, where the semiconductor wafer has been transferred from a receiving unit onto a rotating body of the pre-alignment mechanism by a transfer mechanism, calculating and storing an eccentric value between a shaft center of the rotating body and a center of the semiconductor wafer where the shaft center of the rotating body and the center of the semiconductor wafer being detected by a sensor of the pre-alignment mechanism, correcting a positional deviation of the semiconductor wafer on the rotating body by the transfer mechanism according to the eccentric value, when the eccentric value exceeds a predetermined value, and estimating the eccentric value for the pre-alignment operation of a succeeding semiconductor wafer, based on the eccentric value accumulated during the pre-alignment operation conducted for semiconductor wafers prior to the succeeding semiconductor wafer.

Specifically, the pre-alignment operation stored in the computer readable medium further comprising transferring the succeeding semiconductor wafer from the receiving unit to the rotating body of the pre-alignment mechanism by the transfer mechanism, based on the estimated the eccentric value.

Additionally, a counting number of the succeeding semiconductor wafer may be a number after counting a predetermined number of semiconductor wafers.

According to yet another embodiment, the pre-alignment method of the present disclosure includes rotating the semiconductor wafer W transferred from a cassette C onto a rotating body 6A of a pre-alignment mechanism 6 by a wafer transfer mechanism 5, calculating and storing an eccentric value between a shaft center of the rotating body 6A and a center of the semiconductor wafer W where the shaft center and the rotating body being detected by an optical sensor 6C, and correcting a positional deviation of the semiconductor wafer W on the rotating body 6A by the wafer transfer mechanism 5 based on the eccentric value, when the calculated eccentric value exceeds a defined value, and estimating the eccentric value when conducting the pre-alignment operation of a succeeding semiconductor wafer, based on the eccentric value accumulated during the pre-alignment operation conducted prior to the succeeding semiconductor wafer.

Hereinafter, an exemplary embodiment as a non-limiting example of the present disclosure will be described with reference to appended drawings. In all of the appended drawings, the same or corresponding members (or components) are designated with the same or corresponding reference numerals to omit repeated descriptions.

Figure 1B:
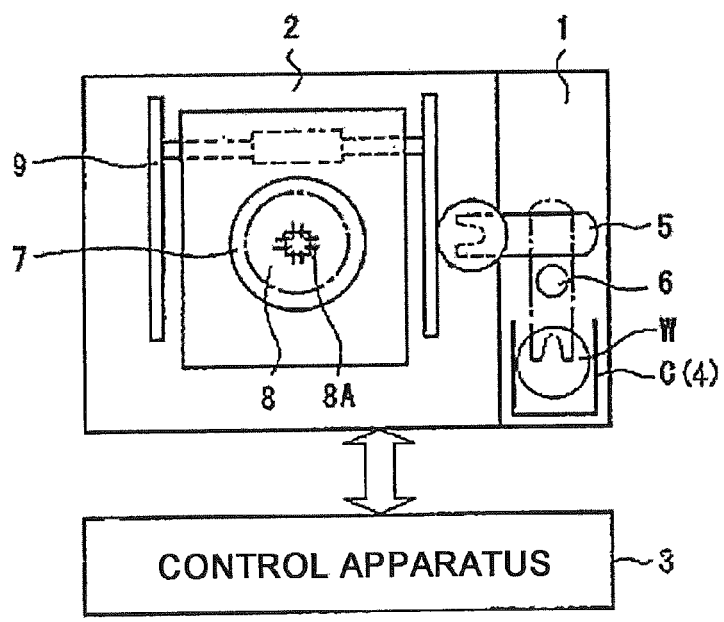

An inspection apparatus used for conducting a pre-alignment method of a semiconductor wafer of the present disclosure will be described. The inspection apparatus as shown in FIGS. 1A and 1B includes a loader chamber 1, a prober chamber 2, and a control apparatus 3. Loader chamber 1 receives semiconductor wafers W by a cassette unit and transfers the semiconductor wafers W in the cassette based on an inspection result. Prober chamber 2 is positioned adjacent to loader chamber 1 and conducts electrical characteristic inspections for the semiconductor wafers W transferred from loader chamber 1. The control apparatus 3 controls a plurality of equipments installed at each of loader chamber 1 and prober chamber 2. Prober chamber 2 is configured to conduct electrical characteristic inspections for a plurality of devices formed on a semiconductor wafer W.

Loader chamber 1 includes a receiving unit 4, a wafer transfer mechanism 5, and a pre-alignment mechanism 6. Receiving unit 4 receives a plurality of semiconductor wafers W by cassette as a unit. Wafer transfer mechanism 5 loads/unloads semiconductor wafers W one by one from a cassette C of receiving unit 4. Pre-alignment mechanism 6 performs a pre-alignment operation of each semiconductor wafer W. In loader chamber 1, after wafer transfer mechanism 5 takes out and transfers a semiconductor wafer W from cassette C to pre-alignment mechanism 6, pre-alignment mechanism 6 performs a pre-alignment operation of the semiconductor wafer W, and then transfers the semiconductor wafer W from pre-alignment mechanism 6 to prober chamber 2, under the control of control apparatus 3. Wafer transfer mechanism 5 then receives an inspected semiconductor wafer W from prober chamber 2 and returns the inspected semiconductor wafer W to the original location of the cassette C.

Prober chamber 2 includes a movable mounting table 7 for mounting the semiconductor wafer, a probe card 8 located above mounting table 7 and includes a plurality of probes 8A, and an alignment mechanism 9 that performs an alignment operation for electric pads and multiple probes 8A. In prober chamber 2, after mounting table 7 receives a semiconductor wafer W from wafer transfer mechanism 5, an alignment operation of the semiconductor wafer W with respect to probe card 8 is performed with an alignment mechanism 9, and an electrical characteristic inspection for a plurality of devices formed on the semiconductor wafer W is performed by electrically contacting electrode pad of the semiconductor wafer W and probes 8A of probe card 8, under the control of control apparatus 3. After the electrical characteristic inspection is completed, wafer transfer mechanism 5 takes out the semiconductor wafer W from mounting table 7.

Figure 2:
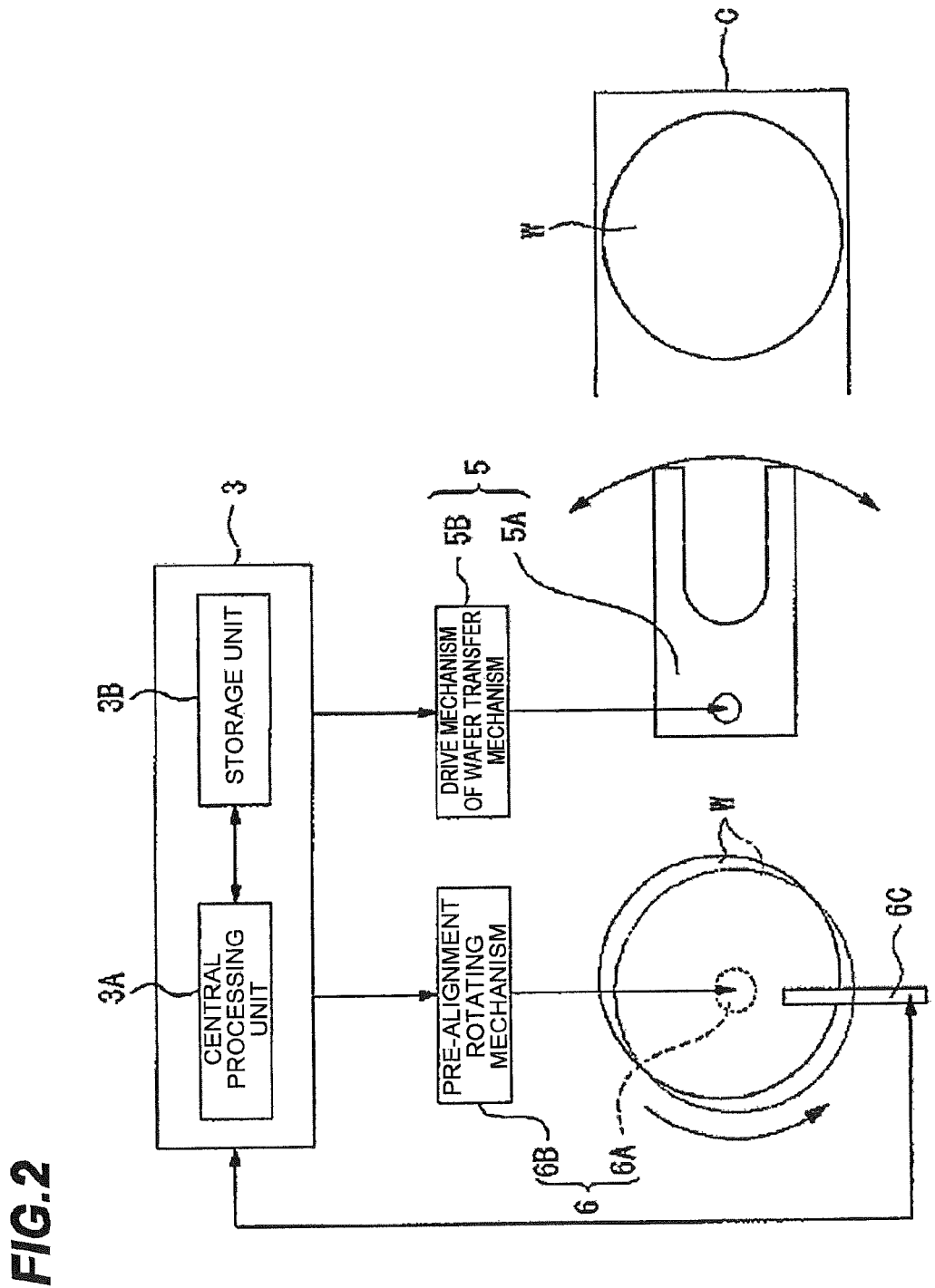
FIG. 2 illustrates a pre-alignment mechanism of the present disclosure used for the inspection apparatus as shown in FIGS. 1A and 1B.

Control apparatus 3, as described in FIG. 2, includes a central processing unit 3A and a storage unit 3B that stores various programs and data for driving the inspection apparatus. Control apparatus 3 controls the devices in loader chamber 1 and prober chamber 2 to perform the electrical characteristic test by receiving program data or stored data between central processing unit 3A and storage unit 3B, and stores received data necessary for the operation in storage unit 3B.

Figure 3:
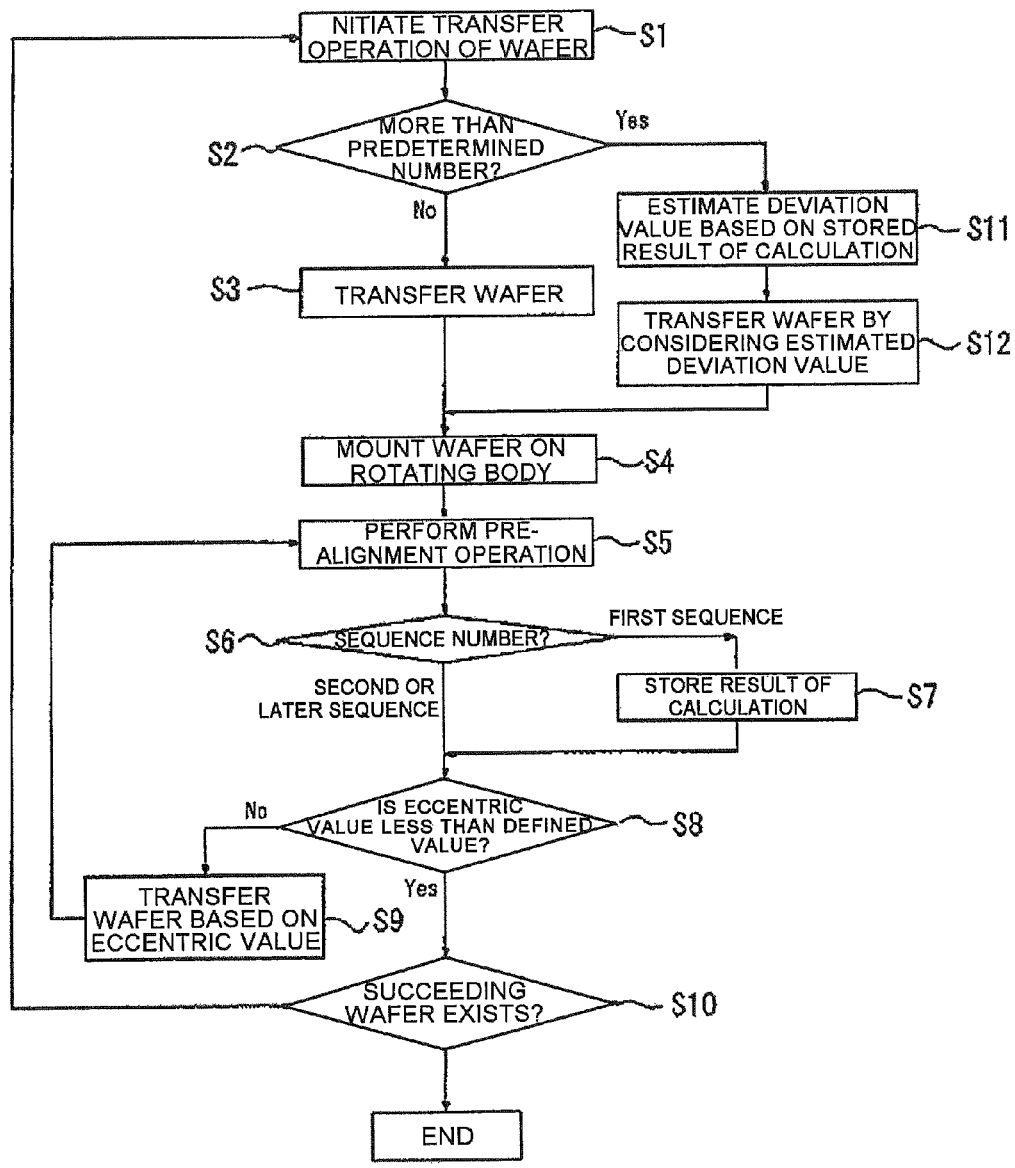
FIG. 3 is a flowchart illustrating an embodiment of the pre-alignment method of the present disclosure.

An exemplary embodiment of a pre-alignment method of semiconductor wafers W (hereinafter pre-alignment method) will be described with reference to FIGS. 2 and 3. As described above, a pre-alignment method of the present disclosure is performed under the control of control apparatus 3 by a combined operation of wafer transfer mechanism 5 and pre-alignment mechanism 6 prior to the electrical characteristic inspection of the semiconductor wafers W.

As illustrated in FIG. 2, wafer transfer mechanism 5 may include a plate-shaped holding unit 5A that absorbs and holds semiconductor wafer W in cassette C using a vacuum, and a drive mechanism 5B that drives holding unit 5A to X, Y and θ direction. Wafer transfer mechanism 5 also transfers semiconductor wafer W between cassette C and mounting table 7 of prober chamber 2 under the control of control apparatus 3.

Pre-alignment mechanism 6 includes a rotating body 6A and a rotating mechanism 6B. Rotating body 6A rotates a semiconductor wafer W with a vacuum absorption and rotating mechanism 6B drives rotating body 6A rotationally. Pre-alignment mechanism 6 rotates the semiconductor wafer W with rotating body 6A under the control of control apparatus 3. An optical sensor 6C is located next to rotating body 6A of pre-alignment mechanism 6. Optical sensor 6C includes a light emitting device and a light receiving device (not shown) positioned, respectively, on above and below the peripheral edge of the semiconductor wafer W. Optical sensor 6C detects a notch formed on outer periphery of the semiconductor wafer W by receiving the light from the light emitting device through the light receiving device.

The pre-alignment method of the present disclosure detects an eccentric value of a center of a semiconductor wafer W and a shaft center of rotating body 6A with optical sensor 6C whenever pre-alignment mechanism 6 performs a pre-alignment operation for a predetermined number of semiconductor wafers W or above, for example 5 semiconductor wafers or above. Central processing unit 3A of control apparatus 3 then calculates the eccentric vale of each of the semiconductor wafers W, based on the detected data of optical sensor 6C, and sequentially performs a statistical treatment for the calculated value of the accumulated eccentric value. Central processing unit 3A of control apparatus 3 then estimates the positional deviation between a center of a succeeding semiconductor wafer W and a shaft center of rotating body 6A.

In performing the pre-alignment method of the present disclosure, central processing unit 3A of control apparatus 3 reads pre-alignment program and data regarding semiconductor wafer W from storage unit 3B. Subsequently, wafer transfer mechanism 5 initiates a transfer operation of a semiconductor wafer W from cassette C, using holding unit 5A (step S1). Central processing unit 3A of control apparatus 3 determines whether the number of transferred semiconductor wafer W is a predetermined number or above (step S2). When the number of transferred semiconductor wafer W is less than the predetermined number, wafer transfer mechanism 5 immediately transfers semiconductor wafer W from cassette C to pre-alignment mechanism 6 (step S3), and mounts semiconductor wafer W on rotating body 6A of pre-alignment mechanism 6 (step S4).

Pre-alignment mechanism 6 performs a pre-alignment operation of the semiconductor wafer W by rotating body 6A at least one turn (step S5). At this time, central processing unit 3A of control apparatus 3 determines the sequence number of the present pre-alignment process (step S6), and optical sensor 6C detects a notch of semiconductor wafer W while semiconductor wafer W is rotating. Based on detected data regarding the notch from optical sensor 6C, central processing unit 3A calculates the eccentric value between a center of the semiconductor wafer W and a shaft center of rotating body 6A, and also calculates deviation angle of a notch from a reference location (step S7).

Further, it is determined whether the calculated eccentric value is not more than a defined value (step S8). If the calculated eccentric value of the semiconductor wafer W is not more than the defined value, wafer transfer mechanism 5 may transfer the semiconductor wafer W to prober chamber 2.

When it is determined at step S8 that the calculated eccentric value is more than the defined value, an accurate alignment operation may not be performed in prober chamber 2 with a transferred semiconductor wafer W even if the semiconductor wafer W is transferred to prober chamber 2. Accordingly, wafer transfer mechanism 5 transfers the semiconductor wafer W on rotating body 6A for the amount of the calculated eccentric value (step S9), and pre-alignment is performed again after returning to step S5. If it is determined that the current pre-alignment is a second pre-alignment at step S6, it is determined whether the eccentric value is less than a defined value based on the detected data from optical sensor 6C at step S8. If it is determined that the eccentric value is less than the defined value, the pre-alignment of the semiconductor wafer W is terminated since the semiconductor wafer W may be transferred to prober chamber 2.

Once the pre-alignment is terminated, it is determined whether there exists a succeeding semiconductor wafer W (step S10). If it is determined that there is a succeeding semiconductor wafer W, a transfer operation of the succeeding semiconductor wafer W is initiated by returning to step S1. It is then determined whether the number of sequence of the succeeding semiconductor wafer W is a predetermined number or above (step S2). Namely, if the sequence number is less than 5, the operations from step 3 to step 10 are repeated until the number of sequence becomes 5.

If it is determined that the fifth wafer is a predetermined number of sequence or above at step S2, the deviation value of the fifth semiconductor wafer W is estimated based on the eccentric value accumulated until fourth semiconductor wafer W (step S11). By accumulating the calculated values until fourth sequence of wafers and performing statistical treatment of the accumulated values such as averaging the accumulated values, a positional deviation value of the fifth semiconductor wafer W on rotating body 6A may be estimated based on the averaged value. By considering the estimated value, the fifth semiconductor wafer W may be transferred to pre-alignment mechanism 6 (step S12) and is mounted on rotating body 6A (step S4). At this time, the positional deviation value of the fifth semiconductor wafer W transferred from cassette C onto rotating body 6A may have been corrected already.

Subsequently, a pre-alignment is performed by driving pre-alignment mechanism 6 and rotating body 6A at least once (step S5). At this time, central processing unit 3A of control apparatus 3 determines the number of pre-alignment sequence for the current semiconductor wafer W. If the number of pre-alignment sequence is determined to be a first sequence, central processing unit 3A calculates the eccentric value between a center of the semiconductor wafer W and a shaft center of rotating body 6A based on the detected data from optical sensor 6C. The calculated eccentric value is then stored at storage unit 3B (step S7) and it is determined whether the calculated eccentric value is less than the defined value (step S8). At this time, the semiconductor wafer W is mounted on rotating body 6A with the positional deviation corrected so that the calculated eccentric value may be less than the defined value. Accordingly, the semiconductor wafer W may be transferred to prober chamber 2 as it is.

If there is an incidence where the calculated eccentric value exceeds the defined value at step S8, steps S9, S5 and S6 are followed, and it is determined whether the eccentric value of the semiconductor wafer W is less than the defined value at step S8. At this time, since the eccentric value becomes less than the defined value, the semiconductor wafer W may be transferred to prober chamber 2.

Subsequently, it is determined whether there is a succeeding semiconductor wafer W at step 10. If a succeeding semiconductor wafer W exists, the pre-alignment of semiconductor wafer W is performed by repeating the same processes as the processes after the second semiconductor wafer W. After the fifth semiconductor wafer W, the pre-alignment operation may be terminated after performing only one pre-alignment, and the semiconductor wafer W may be transferred to prober chamber 2 without further pre-alignment operation.

As described above, a pre-alignment method is disclosed which performs a pre-alignment of a semiconductor wafer W using wafer transfer mechanism 5 and pre-alignment mechanism 6 before a main processing of the semiconductor wafer W. In the pre-alignment method of the present disclosure, a semiconductor wafer W is transferred from a cassette C onto a rotating body 6A of a pre-alignment mechanism 6 by a wafer transfer mechanism 5 and rotated by rotating body 6A (first process). An eccentric value between a shaft center of the rotating body 6A and a center of the semiconductor wafer W is then detected by optical sensor 6C of the pre-alignment mechanism 6, and a control apparatus 3 calculates the eccentric value of the semiconductor wafer W based on the detected value and stores the calculated eccentric value (second process). If the calculated eccentric value exceeds a defined value, the positional deviation of the semiconductor wafer W on rotating body 6A is corrected by wafer transfer mechanism 5 according to the calculated eccentric value (third process). In particular, when conducting a pre-alignment operation for a wafer after a predetermined number of semiconductor wafers (for example, 5 wafers in the present embodiment), the eccentric value of the semiconductor wafer W is estimated based on the eccentric value accumulated in pre-alignment operations performed prior to the predetermined number of semiconductor wafer (fourth process). Therefore, when performing the pre-alignment operation after the fifth semiconductor wafer W, the positional deviation of the semiconductor wafer W on rotating body 6A may be suppressed and only one pre-alignment process may be required when transferring the semiconductor wafer W from cassette C to rotating body 6A. Since it is not necessary to perform the pre-alignment process two times or above, the transfer time from the cassette C to prober chamber 2 may be reduced.

According to the present disclosure, a succeeding semiconductor wafer W is transferred from cassette C onto rotating body 6A of pre-alignment mechanism 6 by transfer mechanism by taking into account the estimated value of the positional deviation on rotating body 6A. As a result, the positional deviation of the succeeding semiconductor wafer W may already be corrected when the succeeding semiconductor wafer W is transferred to rotating body 6A and the succeeding semiconductor wafer W may be mounted on a location of rotating body 6A where only one pre-alignment process is necessary.

Also, according to the present disclosure, since the succeeding semiconductor wafer W is the semiconductor wafer after a predetermined number of semiconductor wafers (5 wafers in this embodiment), the eccentric value of the succeeding semiconductor wafer W on rotating body 6A can be estimated with high accuracy and a transfer precision from cassette C to rotating body 6A can be improved.

While a cassette C is used as a receiving body of semiconductor wafers W in this embodiment, an adapter unit may be used instead of the cassette C. The adapter unit is a receiving body of semiconductor wafers W, which receives semiconductor wafers W promptly one by one by an automatic transfer apparatus, and is used by installing at a load port of a processing apparatus such as an inspection apparatus. The automatic transfer apparatus can transfer the semiconductor wafers W one by one inside the adapter unit with a high precision and reproducibility so that a positional deviation is relatively small between semiconductor wafers W. As a result, the eccentric value of semiconductor wafers W in the pre-alignment operation is suppressed because the positional deviation is relatively small when the semiconductor wafers W are transferred from the adapter unit to the pre-alignment apparatus. Therefore, the accuracy of eccentric value estimation for each semiconductor wafer may be improved so that a pre-alignment operation may be terminated within a relatively short time and the transfer time from the adapter unit to the prober chamber can also be decreased.

In the embodiments described above, an estimation process for the eccentric value is performed after a predetermined number of semiconductor wafers W. However, the estimation can be performed after a second semiconductor wafer W.

The present disclosure may be used properly to conduct a pre-alignment of semiconductor wafer in a processing device such as an inspection apparatus.

The present disclosure provides a pre-alignment method and a computer-readable medium storing a pre-alignment program capable of reducing the pre-alignment time and transfer time of a semiconductor wafer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for conducting a pre-alignment operation of a semiconductor wafer under a control of a control apparatus prior to a processing of the semiconductor wafer, comprising:
  mounting the semiconductor wafer transferred from a receiving unit by a transfer mechanism on a rotating body of a pre-alignment mechanism;
  rotating the semiconductor wafer on the rotating body of the pre-alignment mechanism;
  detecting a shaft center of the rotating body and a center of the semiconductor wafer by a sensor of the pre-alignment mechanism;
  calculating an eccentric value between the shaft center of the rotating body and the center of the semiconductor wafer based on a detected value at the detecting step;
  storing the eccentric value between the shaft center of the rotating body and the center of the semiconductor wafer calculated at the calculating step;
  determining whether the eccentric value calculated at the calculating step exceeds a predetermined value;
  when it is determined that the eccentric value calculated at the calculating step exceeds the predetermined value, correcting a positional deviation of the semiconductor wafer on the rotating body by the transfer mechanism according to the eccentric value calculated at the calculating step;
  determining whether the number of the semiconductor wafer transferred to the rotating body is more than a predetermined number;
  when it is determined that the number of the semiconductor wafer is more than the predetermined number, estimating the eccentric value of a succeeding semiconductor wafer based on the eccentric value stored at the storing step; and mounting the succeeding semiconductor wafer on the rotating body based on the eccentric value estimated at the estimating step.

2. The method of claim 1, further comprising transferring the succeeding semiconductor wafer from the receiving unit to the rotating body of the pre-alignment mechanism by the transfer mechanism based on the estimated eccentric value.

3. The method of claim 1, wherein a counting number of the succeeding semiconductor wafer is a number after counting a predetermined number of semiconductor wafers.

4. A non-transitory computer-readable medium storing a computer executable program that, when executed, causes a computer to conduct a pre-alignment operation of a semiconductor wafer under a control of a control apparatus prior to a processing of the semiconductor wafer, the pre-alignment operation comprises steps of:
   mounting the semiconductor wafer transferred from a receiving unit by a transfer mechanism on a rotating body of a pre-alignment mechanism;
   rotating the semiconductor wafer on the rotating body of the pre-alignment mechanism;
   detecting a shaft center of the rotating body and a center of the semiconductor wafer by a sensor of the pre-alignment mechanism;
   calculating an eccentric value between the shaft center of the rotating body and the center of the semiconductor wafer based on a detected value at the detecting step;
   storing the eccentric value between the shaft center of the rotating body and the center of the semiconductor wafer calculated at the calculating step;
   determining whether the eccentric value calculated at the calculating step exceeds a predetermined value;
   when it is determined that the eccentric value calculated at the calculating step exceeds the predetermined value, correcting a positional deviation of the semiconductor wafer on the rotating body by the transfer mechanism according to the eccentric value calculated at the calculating step;
   determining whether the number of the semiconductor wafer transferred to the rotating body is more than a predetermined number;
   when it is determined that the number of the semiconductor wafer is more than the predetermined number, estimating the eccentric value of a succeeding semiconductor wafer based on the eccentric value stored at the storing step; and
   mounting the succeeding semiconductor wafer on the rotating body based on the eccentric value estimated at the estimating step.

5. The non-transitory computer-readable medium of claim 4, wherein the pre-alignment operation further comprising transferring the succeeding semiconductor wafer from the receiving unit to the rotating body of the pre-alignment mechanism by the transfer mechanism based on the estimated eccentric value.

6. The non-transitory computer-readable recording medium of claim 4, wherein a counting number of the succeeding semiconductor wafer is a number after counting a predetermined number of semiconductor wafers.

* * * * *